United States Patent [19]
Nei

[11] Patent Number: 5,864,386
[45] Date of Patent: Jan. 26, 1999

[54] EXPOSURE APPARATUS

[75] Inventor: Masahiro Nei, Yokohama, Japan

[73] Assignee: Nikon Corporation, Tokyo, Japan

[21] Appl. No.: 904,435

[22] Filed: Jul. 31, 1997

[30] Foreign Application Priority Data

Aug. 1, 1996 [JP] Japan .................................. 8-219193

[51] Int. Cl.[6] .......................... G03B 27/42; G03B 27/52; G01B 9/02
[52] U.S. Cl. .............................. 355/30; 355/53; 356/400; 356/401
[58] Field of Search ................................ 355/30, 53, 72; 356/375, 399, 400, 401

[56] References Cited

U.S. PATENT DOCUMENTS

| | | | |
|---|---|---|---|
| 4,989,031 | 1/1991 | Kamiya | 355/30 |
| 5,469,260 | 11/1995 | Takagi et al. | 356/400 |
| 5,569,930 | 10/1996 | Imai | 355/53 |
| 5,796,469 | 8/1998 | Ebinuma | 355/53 |

*Primary Examiner*—Alan A. Mathews
*Attorney, Agent, or Firm*—Morgan, Lewis & Bockius LLP

[57] ABSTRACT

An exposure apparatus includes a stage, a table mounted on the stage and having a fiduciary mark and a moving mirror, a holder mounted on the stage for holding a substrate, and a temperature control system for regulating heat transfer to the moving mirror and the fiduciary mark and installed in the holder and the table.

19 Claims, 6 Drawing Sheets

EXPOSURE APPARATUS

This application claims the benefit of Japanese patent application No. 8-219193, filed Aug. 1, 1996, which is hereby incorporated by reference.

BACKGROUND OF THE INVENTION

1. Field of the Present Invention

The present invention relates to an exposure apparatus for use in the manufacture of integrated circuits and liquid crystal displays, and more particularly, to maintaining thermal stability of a holding stage on which a substrate is positioned.

2. Discussion of the Related Art

FIG. 6 shows a wafer stage 100 holding a photosensitive substrate such as a wafer 102. The wafer 102 is fastened in place on a wafer holder 104 by means of vacuum suction. The wafer holder 104 is supported on a wafer table 106, and the wafer table 106 is fastened to a base 108.

The wafer table 106 also includes a moving mirror 110 for measuring a position of the wafer stage 100 by means of an interferometer, a fiduciary mark 114 used in a base line checking sequence for measuring a positional relationship between an alignment system (not shown) and a projection optical system 112, and an irradiation monitor 118 for measuring a quantity of light passing through a reticle 116 and the projection optical system 112 in order to control magnification and focus of the projection optical system so as to maintain them at constant levels.

When exposure is initiated, energy of the exposing light is absorbed by a photosensitive material (such as a photoresist) coated onto a surface of the wafer 102. A chemical change occurs in the photosensitive material, and heat is generated in the process. As shown by arrows in FIG. 6, the heat is transferred from the wafer 102 to the wafer holder 104, and from the wafer holder 104 to the wafer table 106. As a result, the moving mirror 110 and the fiduciary mark 114 are heated. Also, if the energy of exposing light is measured by the irradiation monitor 118 prior to the initiation of exposure, heat is similarly transferred to the wafer table 106, so that temperatures of the moving mirror 110 and the fiduciary mark increase.

Furthermore, the wafer stage 100 is driven by a driving means (not shown), such as a DC motor or a linear motor, and heat is also generated when the motor is in operation. Accordingly, even movement of the wafer stage 100 raises the temperature of the wafer table 106, so that the temperatures of the moving mirror 110 and the fiduciary mark 114 increase.

It is important to measure the position of the wafer 102 accurately during exposure of the wafer 102. However, when the temperature of the wafer stage 100 increases for the reasons described above, relative positional relationship of the wafer 102, the moving mirror 110, and the fiduciary mark 114 may change, and the position of the wafer 102 cannot be measured accurately. Accordingly, it becomes impossible to achieve accurate alignment and positioning during the exposure.

SUMMARY OF THE INVENTION

Accordingly, the present invention is directed to an exposure apparatus that substantially obviates one or more of the problems due to the limitations and disadvantages of the related art.

An object of the present invention is to provide an exposure apparatus that makes it possible to maintain a positional relationship of a moving mirror and a fiduciary mark despite temperature fluctuations in a wafer stage, so that an accurate exposure operation can be performed.

Additional features and advantages of the present invention will be set forth in the description which follows, and will be apparent from the description, or may be learned by practice of the invention. The objectives and other advantages of the invention will be realized and attained by the structure and process particularly pointed out in the written description as well as in the appended claims.

To achieve these and other advantages and in accordance with the purpose of the present invention, as embodied and broadly described, in accordance with one aspect of the present invention there is provided an exposure apparatus including a stage, a table mounted on the stage and having a fiduciary mark and a moving mirror, a holder mounted on the stage for holding a substrate, and a temperature control system for regulating heat transfer to the moving mirror and the fiduciary mark and installed in the holder and the table.

In accordance with another aspect of the present invention there is provided an exposure apparatus including a stage having a table with a fiduciary mark used for alignment and a moving mirror used for position measurement, a holder positioned on the stage for holding a substrate, a common base for mounting the fiduciary mark, the moving mirror, and the table, and a temperature controller for controlling a temperature of the substrate and located in the common base.

In accordance with another aspect of the present invention there is provided an exposure apparatus including a stage having a table with a fiduciary mark used for alignment, and a moving mirror used for position measurement, a holder positioned on the stage for holding a substrate, a common base for mounting the fiduciary mark, the moving mirror, and the table, and a temperature controller for controlling a temperature of areas around joints between the fiduciary mark and the table, and between the moving mirror and the table.

In accordance with another aspect of the present invention there is provided an exposure apparatus including a wafer stage having a wafer table and a wafer holder, a moving mirror mounted on the wafer table, a fiduciary mark mounted on the wafer table, a circulation path in the wafer holder and the wafer table for circulating a heat medium, and a temperature controller for controlling the temperature of the wafer holder and the wafer table by circulating the heat medium through the circulation path.

In accordance with another aspect of the present invention there is provided a method of controlling exposure of a photosensitive substrate, the method including the steps of irradiating an irradiation monitor mounted on a wafer table with light from a light source while simultaneously controlling temperature of a wafer table, wherein the light from the light source passes through a reticle and an optical projection system, measuring the amount of light with the irradiation monitor, measuring a base line relationship between a fiduciary mark and a moving mirror, wherein the fiduciary mark and the moving mirror are mounted on the wafer table, positioning a photosensitive substrate on a wafer holder, wherein the wafer holder is mounted on the wafer table, and the wafer table is mounted on a movable wafer stage, and exposing the photosensitive substrate with the light from the light source while controlling temperatures of the wafer holder and the wafer table.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention that together with the description serve to explain the principles of the invention.

Figure 4A:
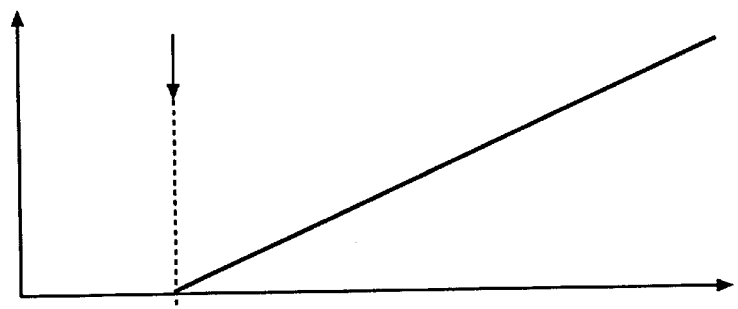
Figure 4B:
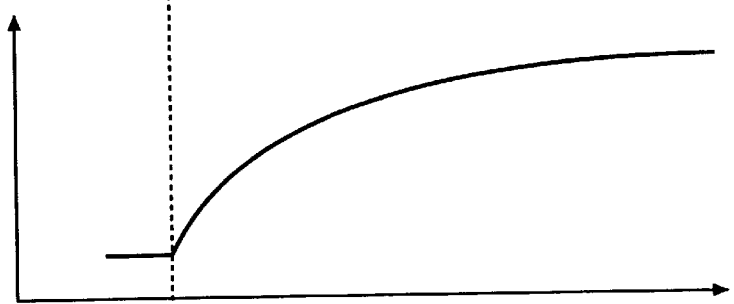
Figure 4C:
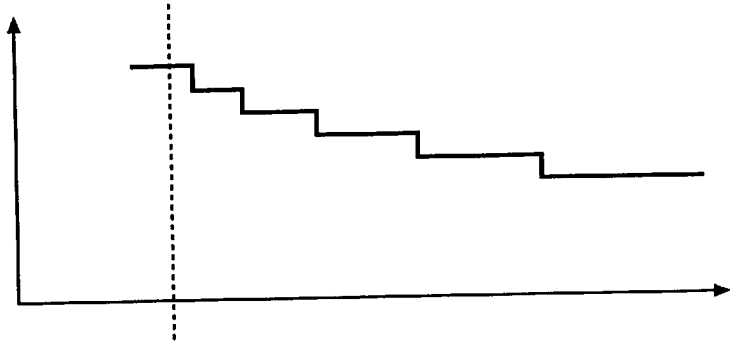

FIGS. 4(A)–4(C) show relationships between wafer temperatures and temperatures of heat media of a fourth preferred embodiment.

Figure 5:
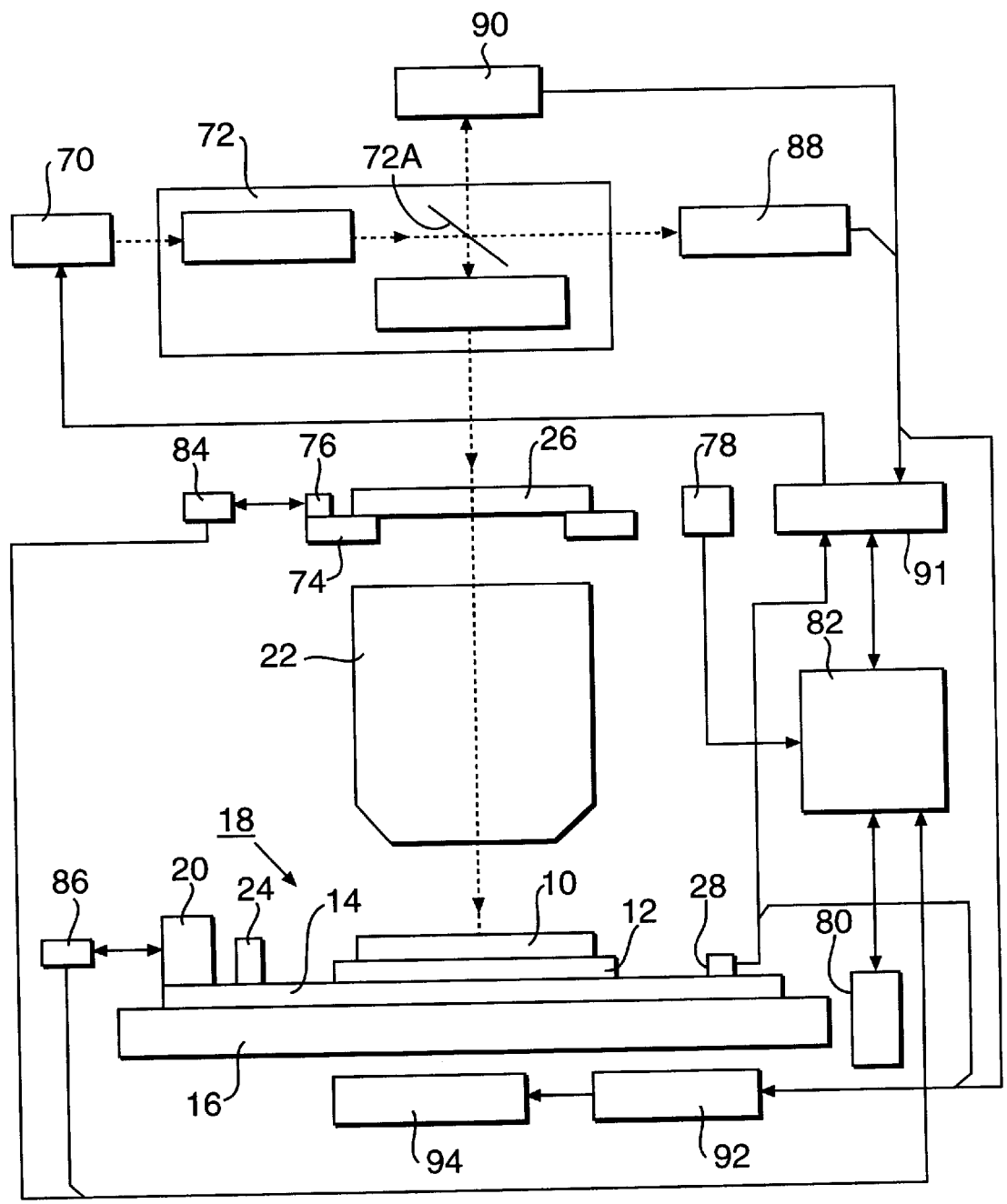

FIG. 5 illustrates the fourth preferred embodiment of the present invention.

Figure 6:
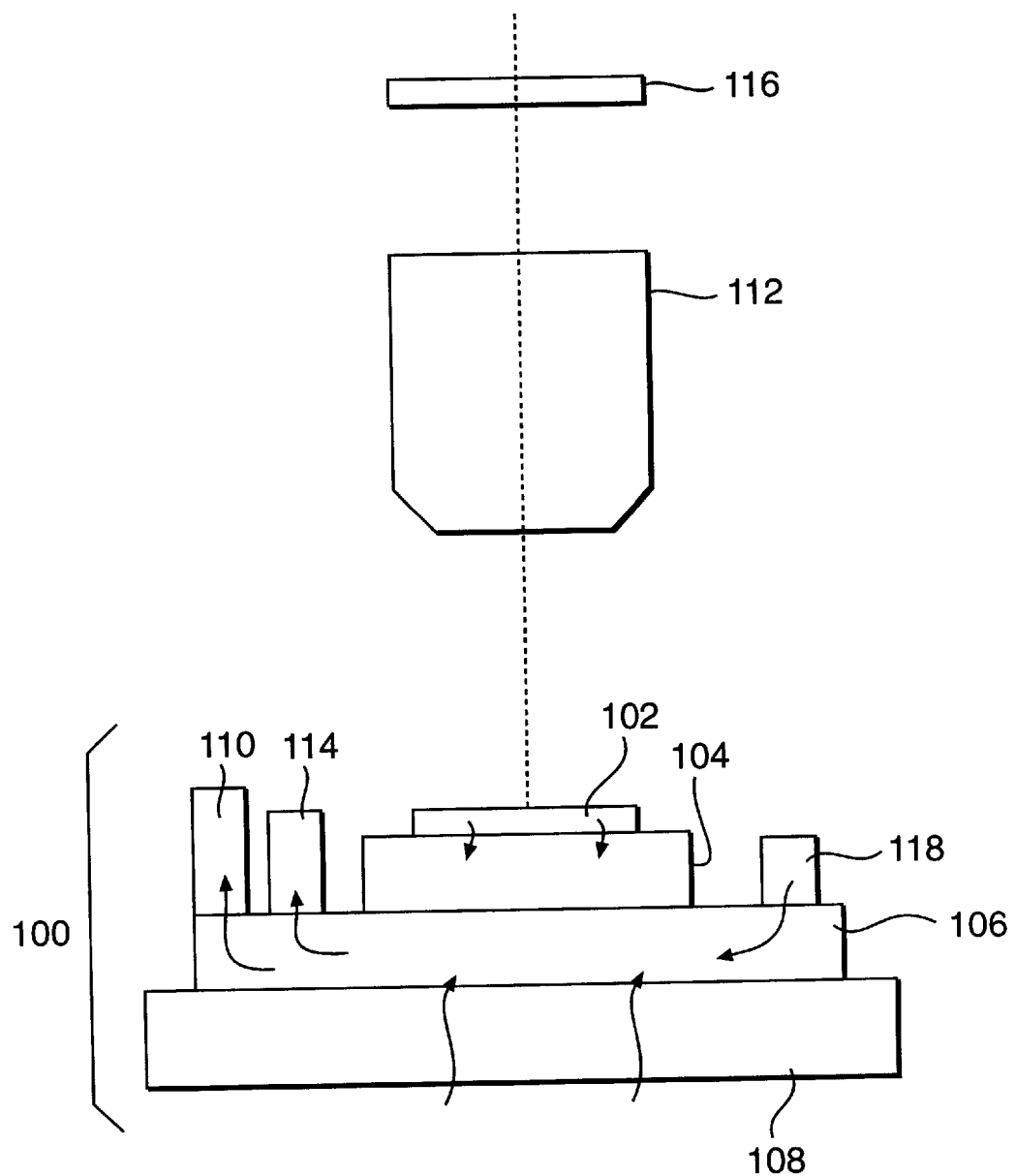

FIG. 6 illustrates a conventional exposure apparatus.

DETAILED DESCRIPTION OF THE PREFERRED EMBODIMENTS

Reference will now be made in detail to the preferred embodiments of the present invention, examples of which are illustrated in the accompanying drawings.

In the present invention, a transfer of heat to a fiduciary mark and a moving mirror is controlled by a temperature control means, so that positional relationship between the fiduciary mark and the moving mirror is maintained substantially constant. Accordingly, base line measurements utilizing the fiduciary mark and stage position measurements utilizing the moving mirror can be performed in a more stable manner, so that the exposure operation can be performed more accurately.

The preferred embodiments of the present invention will first be summarized.

In a first embodiment of the present invention a temperature control means used to control the movement of heat to a fiduciary mark and a moving mirror are positioned in a holder and a table. In a second embodiment of the present invention, a temperature control means is positioned in a common base part, which is installed between a fiduciary mark and a moving mirror, and a table. In a third embodiment of the present invention, a temperature control means is installed in an area around joints between a fiduciary mark and moving mirror, and a table. In a fourth embodiment of the present invention, there is provided an exposure amount detection means for detecting an amount of light exposure on a substrate, and a temperature prediction means for predicting a degree of fluctuation in a temperature of the substrate based on the amount of light exposure. The temperature control means controls the temperature in accordance with the temperature predicted by the temperature prediction means. The exposure amount detection means includes a first exposure amount detection means for detecting the amount of exposure on the side of the substrate, and a second exposure amount detection means for detecting the amount of exposure on the side of a reticle on which a pattern to be projected onto the substrate is drawn.

Figure 1:
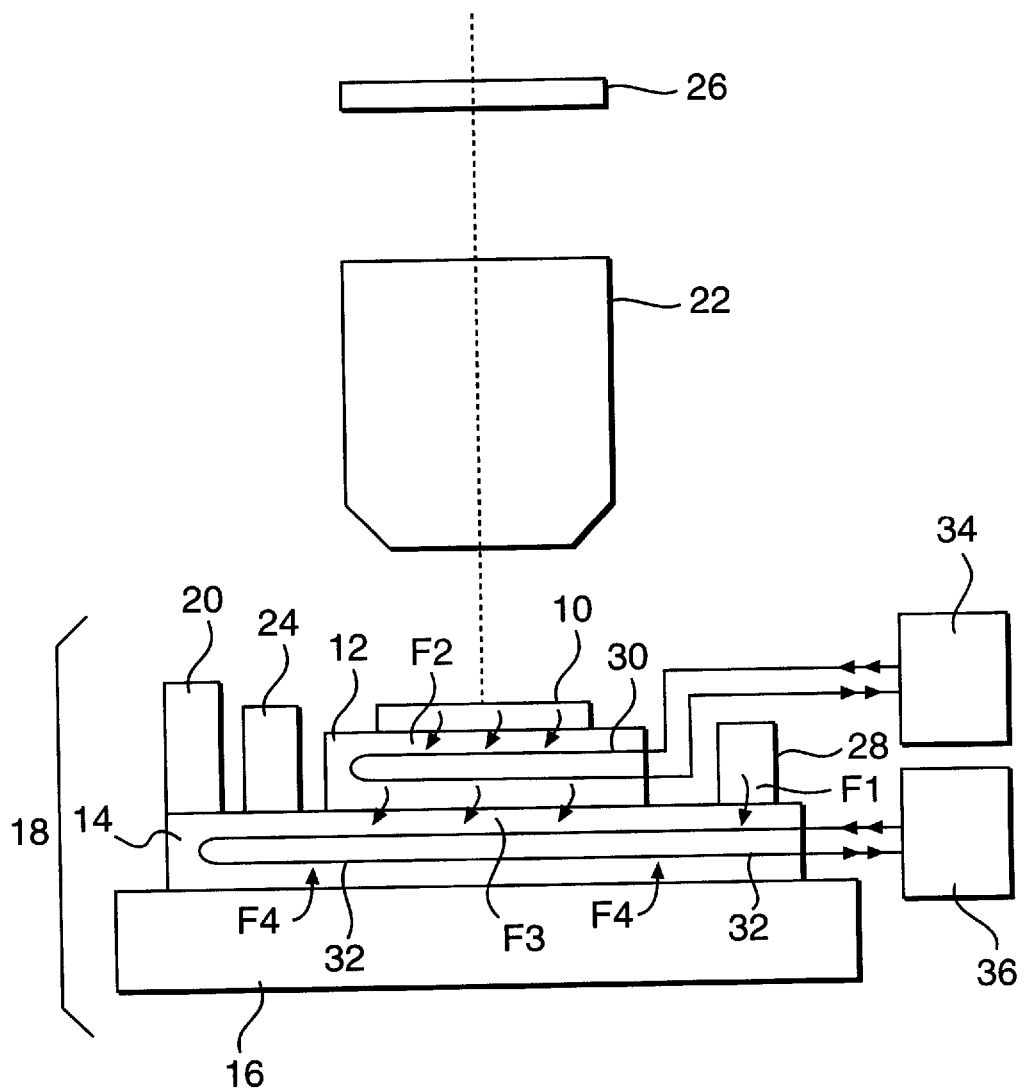
FIG. 1 illustrates a first preferred embodiment of the present invention.

The first preferred embodiment will now be described with reference to FIG. 1. In FIG. 1, a wafer 10 is held on a wafer holder 12 by vacuum suction. The wafer holder 12 is supported on a wafer table 14, and the wafer table 14 is fastened to a base 16. A wafer stage 18 thus includes the wafer holder 12 and the wafer table 14.

The wafer table 14 also includes a moving mirror 20 for measuring a position of the wafer stage 18 by means of an interferometer. A fiduciary mark 24 is used in a base line checking sequence for measuring a positional relationship between an alignment system (not shown) and a projection optical system 22. An irradiation monitor 28 is used for measuring a quantity of light passing through a reticle 26 and the projection optical system 22 in order to control a magnification and focus of the projection optical system 22 to maintain them at constant levels.

Circulation paths 30 and 32, through which a heat medium circulates, are installed in the wafer holder 12 and the wafer table 14. The circulation paths 30 and 32 are connected to temperature control units 34 and 36, respectively, and arranged so that a heat medium, such as a liquid or air, whose temperature is controlled by the temperature control units 34 and 36, flows through the circulation paths 34 and 36.

Next, operation of the first preferred embodiment will be described. Light emitted from a light source (not shown), such as a mercury lamp or an excimer laser, passes through an illumination optical system (not shown), and is directed onto the reticle 26. A reticle pattern corresponding to a pattern to be formed on the wafer 10 is etched on a surface of the reticle 26. Light passing through the reticle 26 is reduced by a projection lens 22, and is directed onto the wafer 10, which is fastened to the wafer stage 18, so that the reticle pattern is projected onto the wafer 10 and exposed.

A heat medium having a controlled temperature is supplied from the temperature control unit 34, circulating through the circulation path 30 inside the wafer holder 12. Another heat medium, also having a controlled temperature, is supplied from the temperature control unit 36, circulating through the circulation path 32 inside the wafer table 14.

When the amount of exposing light is measured prior to the exposure operation, the wafer table 14 moves so that the exposing light is incident on the irradiation monitor 28. When the exposing light is directed onto the irradiation monitor 28 and measurement begins, temperature of the irradiation monitor 28 rises. Heat is transmitted to the wafer table 14, as indicated by arrow F1 in FIG. 1. However, the heat medium is circulating through the circulation path 32 in the wafer table 14. Accordingly, the heat transmitted to the wafer table 14 is discharged to the outside of the wafer holder 12, so that transfer of heat to the moving mirror 20 and the fiduciary mark 24 is inhibited.

Next, when the exposure operation is initiated, the wafer 10 absorbs the energy of the exposing light so that the temperature of the wafer 10 rises. The heat is gradually transmitted from the wafer 10 to the wafer holder 12, as indicated by arrows F2. However, as described above, the wafer holder 12 is temperature-controlled. Accordingly, the heat transmitted from the wafer 10 is transferred to the heat medium in the circulation path 30, and is discharged to the outside of the wafer holder 12. Furthermore, even if the heat is transmitted from the wafer holder 12 to the wafer table 14 as indicated by arrows F3, the heat is discharged to the outside of the wafer holder 12 by the heat medium circulating through the circulation path 32 inside the wafer table 14.

Furthermore, since it is necessary to move the stage during the exposing light measurement and exposure operation, the wafer stage 18 is driven by a motor (not shown). Since the motor generates heat, the temperature of the wafer stage 18 rises each time the stage moves, and heat is transmitted to the wafer table 14, as indicated by arrows F4. However, the wafer table 14 is temperature-controlled, as described above. Accordingly, the heat generated by the motor is also discharged to the outside of the wafer holder 12, so that the heat transfer to the moving mirror 20 and the fiduciary mark 24 is inhibited.

Thus, the heat generated by the operations described above is discharged to the outside by the heat medium circulating in the wafer holder 12 and the heat medium circulating in the wafer table 14. In other words, the heat transfer to the moving mirror 20 and the fiduciary mark 24 is controlled by the heat media in the circulation paths 30 and 32. As a result, displacement of the moving mirror 20 and the fiduciary mark 24 caused by effects of the heat is prevented, so that the relative positional relationship between the wafer 10, the moving mirror 20, and the fiduciary mark 24 is maintained substantially constant. Accordingly, base line measurements and measurement of the position of the wafer stage 18 can be performed with high precision, and an accurate exposure operation can be performed on a basis of these measurements.

A second preferred embodiment will now be described with reference to FIG. 2. In the first embodiment, it was assumed that the positional relationship of the wafer 10, the moving mirror 20 and the fiduciary mark 24 had to be maintained. This is important for the exposure operation. However, in a case of superimposed exposure of patterns, it is sufficient for only the positional relationship of the moving mirror 20 and the fiduciary mark 24 to stay constant. This is because once base line checking has been performed, no exposure error will be generated even if a distance between the wafer 10, the moving mirror 20, and the fiduciary mark 24 changes, as long as there is no change in the base line measurement of the distance between the moving mirror 20 and the fiduciary mark 24.

However, if the positional relationship between the moving mirror 20 and the fiduciary mark 24 varies, even if base line checking is performed, it is impossible to determine whether a variation detected by the baseline checking results from movement of an alignment sensor, or from a change in the relationship between the moving mirror 20 and the fiduciary mark 24. Accordingly, the exposure results of the pattern superimposition are poor. The second preferred embodiment is designed to avoid a thermal effect on the positional relationship of the moving mirror 20 and the fiduciary mark 24 that is present in the first embodiment.

Figure 2:
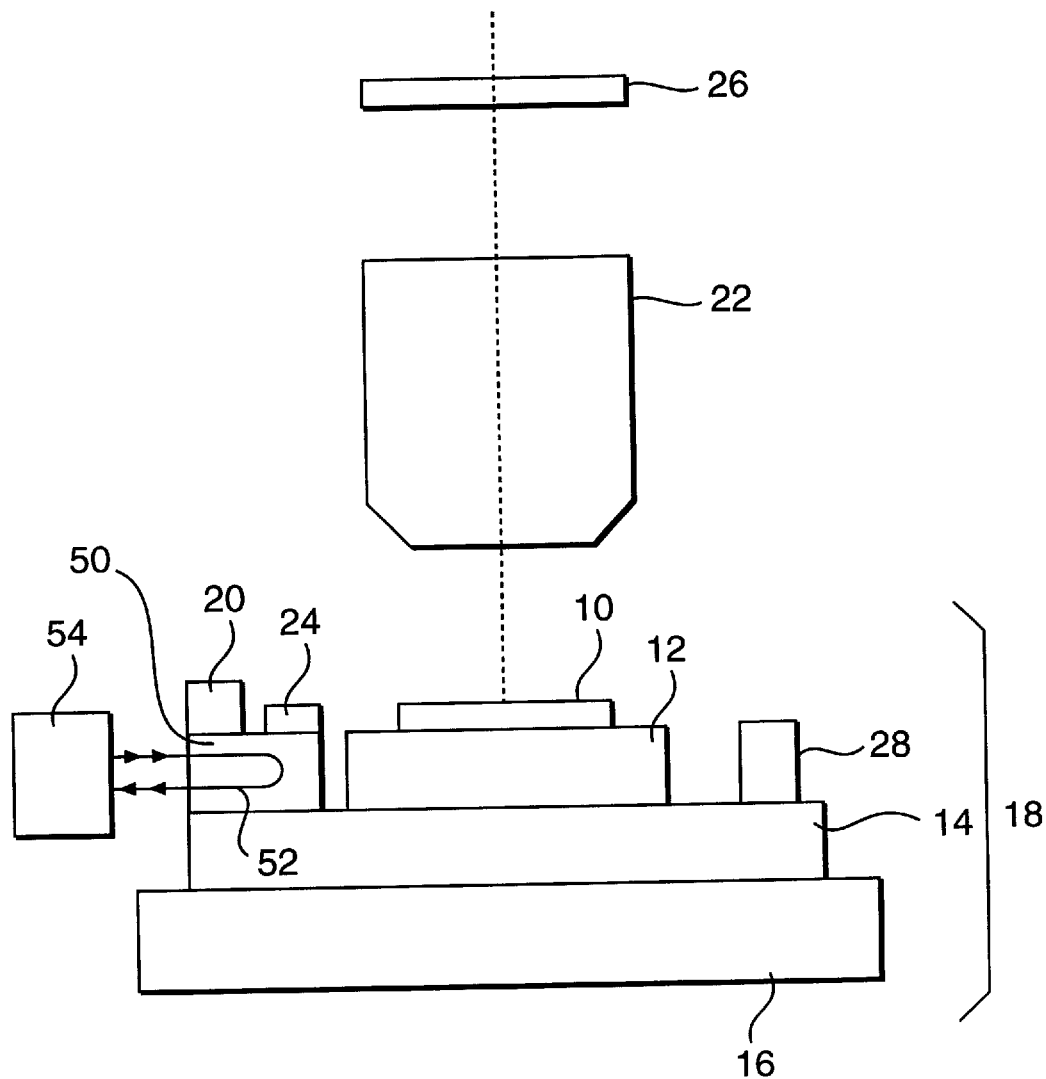
FIG. 2 illustrates a second preferred embodiment of the present invention.

In the second preferred embodiment, as shown in FIG. 2, the moving mirror 20 and the fiduciary mark 24 are positioned on a common base 50. The common base 50 is mounted on a wafer table 14. A circulation path 52 is formed inside the common base 50. The circulation path 52 is connected to a temperature control unit 54. A heat medium with adjustable temperature flows through the circulation path 52 by the temperature control unit 54. Additional circulation paths may also be formed in the wafer holder 12 and wafer table 14. Other elements of the second preferred embodiment are similar to corresponding elements of the first preferred embodiment.

In the second preferred embodiment, the moving mirror 20 and the fiduciary mark 24 are installed on the common base 50, and the common base 50 is temperature-controlled by the heat medium supplied from the temperature control unit 54. Accordingly, heat from the irradiation monitor (corresponding to that indicated by the arrow F1 in FIG. 1), heat from the wafer 10 (corresponding to that indicated by the arrows F2 and F3 in FIG. 1), and heat from the motor (corresponding to that indicated by the arrows F4 in FIG. 1) are all discharged to the outside by the common base 50, so that no heat is transmitted to the moving mirror 20 or the fiduciary mark 24. Accordingly, regardless of the positional relationship between the wafer 10 and the moving mirror 20, or between the wafer 10 and the fiduciary mark 24, thermal effects on the positional relationship between the moving mirror 20 and the fiduciary mark 24 are reduced, so that an exposure operation can be performed without a risk of misalignment.

Figure 3:
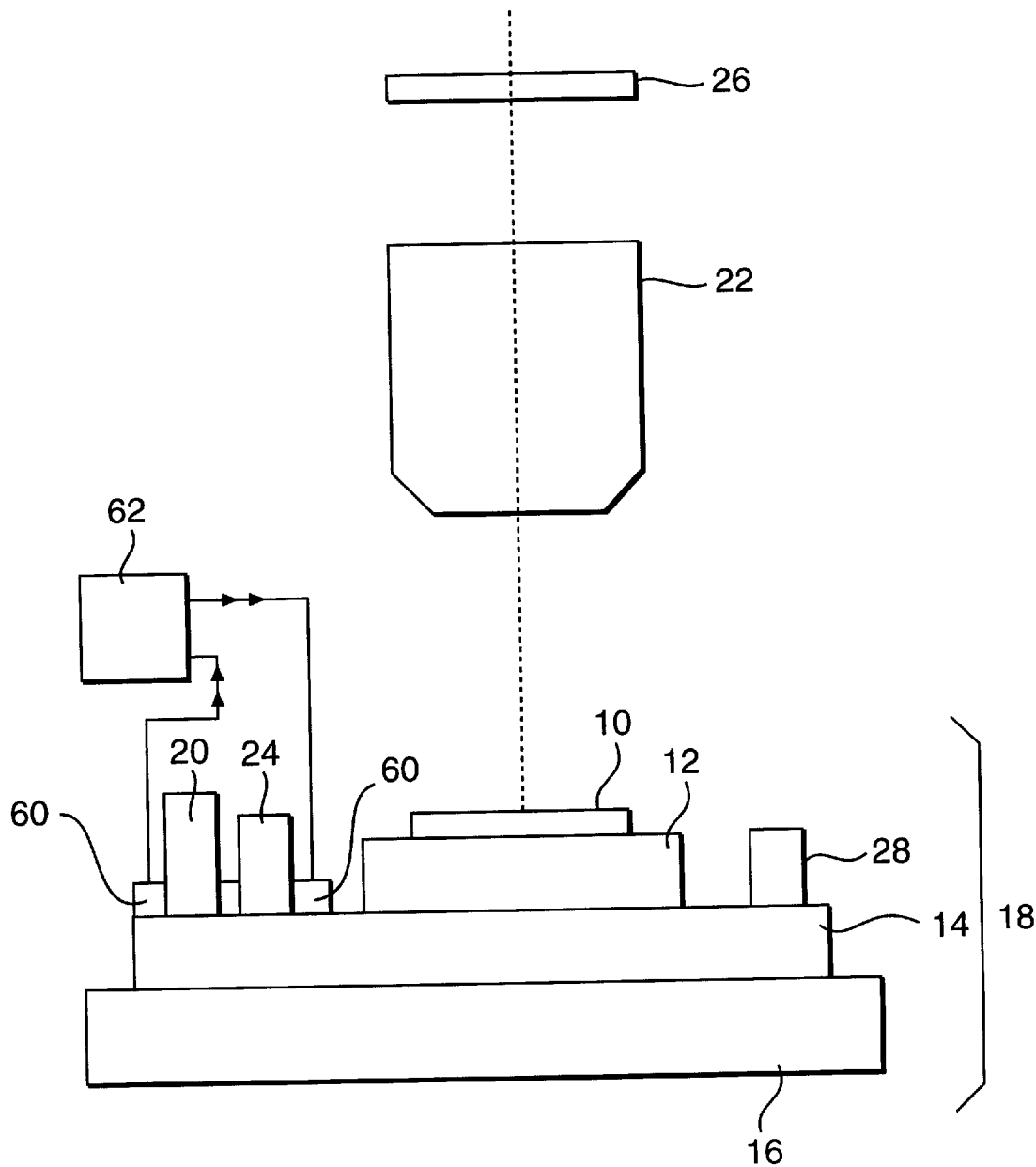
FIG. 3 illustrates a third preferred embodiment of the present invention.

A third preferred embodiment will now be described with reference to FIG. 3. The third preferred embodiment is a modification of the second preferred embodiment with a circulation path 60 provided in an area around joints between a moving mirror 20 and a wafer table 14, and between a fiduciary mark 24 and the wafer table 14. A circulation path 60 is connected to a temperature control unit 62, so that a heat medium with a controlled temperature flows through the circulation path 60.

In the third preferred embodiment, when heat from directions corresponding to those indicated by the arrows F1 through F4 in FIG. 1 is transferred to the moving mirror 20 and the fiduciary mark 24, the heat is absorbed by the heat medium circulating through the circulation path 60, and is discharged to the outside via the temperature control unit 62. As a result, as in the case of the second preferred embodiment, thermal effect on the positional relationship between the moving mirror 20 and the fiduciary mark 24 is favorably reduced. Furthermore, in the third preferred embodiment, the circulation path may be provided in the area around the moving mirror 20 and the fiduciary mark 24 to simplify assembly.

A fourth preferred embodiment will be described with reference to FIGS. 4(A)–4(C) and 5. In the preferred embodiments one, two and three described above, thermal effects were reduced by circulating a heat medium at a fixed temperature through circulation path(s) formed in portions of the wafer stage 20. However, temperature of the wafer 10 during the exposure operation is not necessarily constant, since ordinarily the temperature of the wafer 10 rises as exposure time increases. As shown in FIG. 4(A), when exposure is initiated, the amount of energy delivered by the exposing light increases generally with time. As shown in FIG. 4(B), the wafer temperature gradually increases as exposure is initiated, but eventually approaches a constant temperature level. Accordingly, thermal effects can be reduced more reliably by predicting the temperature rise and controlling the temperature of the heat medium, rather than by circulating the heat medium at a constant temperature.

FIG. 5 shows an exposure apparatus of the fourth preferred embodiment. In FIG. 5, exposing light from a light source 70 passes through an illumination optical system 72 and is incident on a reticle 26. The reticle 26 is fastened to a reticle stage 74, and a moving mirror 76 is installed on the reticle stage 74 to perform positional measurements. The exposing light that passes through the reticle 26 then passes through a projection optical system 22, and is directed onto a wafer 10.

A reticle stage 74 is driven by a driving means 78, and a wafer stage 18 is driven by a driving means 80. The driving means 78 and 80 are connected to a main controller 82. A reticle stage side interferometer 84 and a wafer stage side interferometer 86 are also connected to the main controller 82. Driving control is performed by the main controller 82 based on measurements by the reticle stage side interferometer 84 and the wafer stage side interferometer 86.

An integrator sensor 88 is installed on the exposing light transmission side of a mirror 72A, which is located in the illumination optical system 72. A reflectivity monitor 90 is positioned on the reticle side of the mirror 72A to monitor light reflected from the moving mirror 76. The integrator sensor 88 and the reflectivity monitor 90 are connected to an exposure controller 91 along with the irradiation monitor 28. The exposure controller 91 uses outputs of the integrator sensor 88 and monitor 90 to control the amount of light emitted by the light source 70. A method used to control the exposure is disclosed, for example, in Japanese Patent Application Kokai No. 6-349712.

In the fourth preferred embodiment, the irradiation monitor 28, the integrator sensor 88 and the reflectivity monitor 90 are connected to a temperature predictor 92. The temperature predictor 92 predicts a temperature rise of the wafer stage 18 based on information from the irradiation and reflectivity monitors 28 and 90 and the integrator sensor 88. As described above, the amount of exposing light actually directed onto the wafer prior to exposure is monitored by the irradiation monitor 28. The intensity of the exposing light from the light source 70 is detected by the integrator sensor 88. Furthermore, the extent to which the exposing light is reflected by the reticle 26 and the wafer 10 is monitored by the reflectivity monitor 90. The integrator sensor 88 and the reflectivity monitor 90 can operate regardless of whether an exposure operation is being performed.

The output side of the temperature predictor 92 is connected to a temperature control unit 94, and a heat medium is supplied to circulation path(s) (similar to preferred embodiments one through three) by the temperature control unit 94.

Next, operation of the fourth preferred embodiment will be described. First, the amount of exposing light on the wafer side prior to the initiation of exposure is measured by the irradiation monitor 28. The amount of light from the light source 70 is detected by the integrator sensor 88, and the amount of exposing light reflected by the reticle 26 and the wafer 10 is detected by the reflectivity monitor 90. The temperature predictor 92 determines how much exposing light is emitted by the light source 70, and also determines how much of the exposing light is used for irradiation of the wafer 10, and how much of the exposing light is reflected.

When the exposure operation is initiated, no measurement is performed by the irradiation monitor 28; however, measurements continue to be performed by the integrator sensor 88 and the reflectivity monitor 90. In the temperature predictor 92, a drop in the output of the light source 70 is determined from the output of the integrator sensor 88, and the amount of reflected exposing light is determined from the output of the reflectivity monitor 90. If these values are subtracted from the amount of irradiation on the wafer 10 at a time when exposure is initiated, the amount of exposing light at this point in time can be roughly predicted. In other words, the graph shown in FIG. 4(A) can be predicted. Accordingly, the degree of the temperature rise of the wafer stage 18 shown in FIG. 4(B) can also be predicted. Such a temperature prediction is performed by the temperature predictor 92, and the temperature control unit 94 functions on the basis of the results of this prediction. For example, the temperature of the heat medium is controlled as shown in FIG. 4(C) with respect to the temperature rise shown in FIG. 4(B).

Thus, in the fourth preferred embodiment, the temperature of the heat medium circulating through the circulation path(s) formed in portions of the wafer stage 18 is predicted and controlled on a basis of detection results obtained by a means that detects the amount of exposure on the wafer side (for example, the irradiation monitor 28), and a means that detects the amount of exposure on the reticle side (for example, the integrator sensor 88 and the reflectivity monitor 90). Accordingly, even if the temperature of the wafer stage 18 rises as the exposure operation proceeds, the temperature rise can be tracked, and the positional relationship of the wafer 10, the moving mirror 20 and the fiduciary mark 24 can be maintained.

The present invention has a number of possible working configurations. For example, the following modifications are possible:

(1) Instead of using a fluid (such as a liquid) or a gas (such as air) as the heat medium for temperature control, it is possible to use a solid temperature control element, such as a Peltier element.

(2) Instead of exposing a wafer, other substrates may be used, such as a glass substrate for a liquid crystal display.

(3) In the first preferred embodiment, two separate temperature control units were used for the wafer holder 12 and the wafer table 14, so that the temperature of the heat medium could be independently controlled on the wafer holder 12 side and on the wafer table 14 side. However, if such independent control is unnecessary, a single temperature control unit may be used for both the wafer holder 12 and the wafer table 14. The extent of temperature control may be improved even further by combining several of the preferred embodiments described above.

(4) Although the above preferred embodiments are primarily concerned with a rise in temperature, they can also be used for temperature fluctuations in general.

Thus, the present invention has the following advantages:

Since a temperature control means is provided in order to control transfer of heat to the fiduciary mark 24 and the moving mirror 20, thermal effects on the positional relationship between the fiduciary mark 24 and the moving mirror 20 can be reduced, so that a more accurate exposure operation can be performed.

Since the amount of exposure on the wafer 10 (or any substrate) is detected, the degree of the temperature rise in the wafer 10 is predicted on the basis of the detection results, and the temperature of the wafer 10 is controlled according to this predicted temperature. Thus, the positional relationship between the fiduciary mark 24 and the moving mirror 20 is favorably maintained even if the amount of exposure fluctuates, and an accurate exposure operation can be performed.

While the invention has been described in detail and with reference to specific embodiments thereof, it will be apparent to one skilled in the art that various changes and modifications can be made therein without departing from the spirit and scope thereof. Thus, it is intended that the present invention cover the modifications and variations of this invention provided they come within the scope of the appended claims and their equivalents.

I claim:

1. An exposure apparatus, comprising:

a stage;

a table mounted on the stage and having a fiduciary mark and a moving mirror;

a holder mounted on the stage for holding a substrate; and a temperature control system for regulating heat transfer to the moving mirror and the fiduciary mark and installed in the holder and the table.

2. An exposure apparatus, comprising:
   a stage having a table with a fiduciary mark used for alignment and a moving mirror used for position measurement;
   a holder positioned on the stage for holding a substrate;
   a common base for mounting the fiduciary mark, the moving mirror, and the table; and
   a temperature controller for controlling a temperature of the substrate and located in the common base.

3. An exposure apparatus, comprising:
   a stage having a table with a fiduciary mark used for alignment and a moving mirror used for position measurement;
   a holder positioned on the stage for holding a substrate;
   a common base for mounting the fiduciary mark, the moving mirror, and the table; and
   a temperature controller for controlling a temperature of areas around joints between the fiduciary mark and the table, and between the moving mirror and the table.

4. The exposure apparatus of claim 3, further including:
   an exposure amount detector for detecting an amount of exposure of the substrate; and
   a temperature predictor for predicting fluctuation in a temperature of the substrate in response to output of the exposure amount detector,
   wherein the temperature controller controls the temperature of the substrate in response to an output of the temperature predictor.

5. The exposure apparatus of claim 4, wherein the exposure amount detector further includes:
   a first exposure amount detector for detecting an amount of exposure on a side of the substrate; and
   a second exposure amount detector for detecting an amount of exposure on a side of a reticle.

6. An exposure apparatus, comprising:
   a wafer stage having a wafer table and a wafer holder;
   a moving mirror mounted on the wafer table;
   a fiduciary mark mounted on the wafer table;
   a circulation path in the wafer holder and the wafer table for circulating a heat medium; and
   a temperature controller for controlling the temperature of the wafer holder and the wafer table by circulating the heat medium through the circulation path.

7. The exposure apparatus of claim 6, further including an interferometer for use in conjunction with the moving mirror to determine a position of the wafer stage.

8. The exposure apparatus of claim 6, wherein the circulation path includes a first path through the wafer holder and a second path through the wafer table, and wherein the temperature controller includes a first temperature control unit for controlling circulation of a first heat medium through the first path, and a second temperature control unit for controlling circulation of a second heat medium through the second path.

9. The exposure apparatus of claim 6, further including:
   a reticle having a reticle pattern;
   a projection optical system for projecting the reticle pattern onto a photosensitive substrate mounted on the wafer holder; and
   an irradiation monitor for measuring an amount of light passing through the projection optical system.

10. The exposure apparatus of claim 6, further including a common base mounted on the wafer table, wherein the moving mirror and the fiduciary mark are mounted on the common base.

11. The exposure apparatus of claim 6, further including:
    an additional circulation path in an area near joints between the moving mirror and the wafer table, and between the fiduciary mark and the wafer table; and
    an additional temperature controller for circulating an additional heat medium through the additional circulation path.

12. The exposure apparatus of claim 6, further including:
    a reticle stage having a reticle and a second moving mirror;
    a light source for illuminating the reticle;
    a projection optical system for projecting a pattern formed on the reticle onto a photosensitive substrate mounted on the wafer stage;
    a wafer stage side interferometer for outputting a first signal in conjunction with the moving mirror and corresponding to a position of the wafer stage;
    a reticle stage side interferometer for outputting a second signal in conjunction with the second moving mirror and corresponding to a position of the reticle stage;
    a controller controlling a position of the reticle stage in response to the first and second signals;
    a temperature predictor for predicting a temperature of the photosensitive substrate in response to a measurement of an amount of light from the light source; and
    a main controller for adjusting the position of the wafer stage in response to a prediction of the temperature predictor.

13. A method of controlling exposure of a photosensitive substrate, the method comprising the steps of:
    irradiating an irradiation monitor mounted on a wafer table with light from a light source while simultaneously controlling temperature of a wafer table, wherein the light from the light source passes through a reticle and an optical projection system;
    measuring the amount of light with the irradiation monitor;
    measuring a base line relationship between a fiduciary mark and a moving mirror, wherein the fiduciary mark and the moving mirror are mounted on the wafer table;
    positioning a photosensitive substrate on a wafer holder, wherein the wafer holder is mounted on the wafer table, and the wafer table is mounted on a movable wafer stage; and
    exposing the photosensitive substrate with the light from the light source while controlling temperatures of the wafer holder and the wafer table.

14. The method of claim 13, wherein the step of measuring a base line relationship between a fiduciary mark and a moving mirror includes measuring the base line relationship with an interferometer.

15. The method of claim 13, wherein the step of exposing the photosensitive substrate with the light from the light source while controlling temperatures of the wafer holder and the wafer table includes circulating a first heat medium through a first circulation path in the wafer holder and a circulating a second heat medium through a second circulation path in the wafer table.

16. The method of claim 13, wherein the step of measuring a base line relationship between a fiduciary mark and a moving mirror includes measuring a distance between the fiduciary mark and the mirror, wherein the fiduciary mark and the moving mirror are mounted on a common base, and wherein the common base is temperature controlled.

17. The method of claim 13, wherein the step of exposing the photosensitive substrate with the light from the light source while controlling temperatures of the wafer holder and the wafer table includes controlling a temperature of joints between the fiduciary mark and the wafer table, and between the moving mirror and the wafer table.

18. The method of claim 13, wherein the step of exposing the photosensitive substrate with the light from the light source while controlling temperatures of the wafer holder and the wafer table includes predicting temperature fluctuations in the wafer holder and the wafer table, and controlling the temperatures of the wafer holder and the wafer table in response to the prediction of the temperature fluctuations.

19. The method of claim 13, wherein the step of measuring a base line relationship includes measuring a distance between the moving mirror and the fiduciary mark with an interferometer.

* * * * *